United States Patent
Nakada et al.

(10) Patent No.: US 7,240,178 B2
(45) Date of Patent: Jul. 3, 2007

(54) NON-VOLATILE MEMORY AND NON-VOLATILE MEMORY DATA REWRITING METHOD

(75) Inventors: Mitsuru Nakada, Kanagawa (JP); Mitsuhiko Tomita, Tokyo (JP)

(73) Assignee: Sony Corporation (JP)

( * ) Notice: Subject to any disclaimer, the term of this patent is extended or adjusted under 35 U.S.C. 154(b) by 320 days.

(21) Appl. No.: 10/484,322

(22) PCT Filed: Jul. 19, 2002

(86) PCT No.: PCT/JP02/07356

§ 371 (c)(1),
(2), (4) Date: Oct. 8, 2004

(87) PCT Pub. No.: WO03/010671

PCT Pub. Date: Feb. 6, 2003

(65) Prior Publication Data

US 2005/0036390 A1 Feb. 17, 2005

(30) Foreign Application Priority Data

Jul. 25, 2001 (JP) ............................. 2001-225015
Aug. 3, 2001 (JP) ............................. 2001-236928

(51) Int. Cl.
*G06F 12/16* (2006.01)
(52) U.S. Cl. .................................................... 711/203
(58) Field of Classification Search ................ 711/203, 711/165; 714/5
See application file for complete search history.

(56) References Cited

U.S. PATENT DOCUMENTS

| 5,987,563 | A | * | 11/1999 | Itoh et al. ................... 711/103 |
| 6,145,051 | A | * | 11/2000 | Estakhri et al. ............. 711/103 |
| 6,591,328 | B1 | * | 7/2003 | Iida et al. ................... 711/103 |
| 2003/0163631 | A1 | * | 8/2003 | Aasheim et al. ............ 711/103 |

FOREIGN PATENT DOCUMENTS

JP 11-272569 A1 10/1999
JP 2001-147864 A1 5/2001

* cited by examiner

*Primary Examiner*—Kevin L. Ellis
*Assistant Examiner*—Shawn Eland
(74) *Attorney, Agent, or Firm*—Lerner, David, Littenberg, Krumholz & Mentlik, LLP

(57) ABSTRACT

A nonvolatile memory and a data rewriting method of the nonvolatile memory that can readily detect a state of operation at a time of a system failure due to a power failure or the like and quickly and reliably restore the nonvolatile memory to a normal storage state by a simple method. In the nonvolatile memory including a physical block as a storage unit, the physical block having a data area (1) and a redundant area (2), the redundant area (2) includes: a logical block address storing area (3) for storing an address of a corresponding logical block; a previously used physical block address storing area (4) for storing an address of a physical block to be erased; and a status information storing area (6) for storing status information for distinguishing a state of operation in each stage occurring in performing data rewriting operation on the physical block.

7 Claims, 9 Drawing Sheets

FIG. 5

| | | SEARCHED PHYSICAL BLOCK (P2) | | | | | PREVIOUSLY USED PHYSICAL BLOCK (P1) | | |
|---|---|---|---|---|---|---|---|---|---|
| | DATA | STATUS INFOR-MATION | LOGICAL BLOCK ADDRESS | PREVIOUSLY USED PHYSICAL BLOCK ADDRESS | ERROR CORRECTION CODE | STATUS INFOR-MATION | LOGICAL BLOCK ADDRESS | PREVIOUSLY USED PHYSICAL BLOCK ADDRESS |
| 0 | INITIAL STATE | [F]h | FFFFh | FFFFh | FFFFh | FFh | 0000h | L | P0 |
| 1 | DATA WRITING | 1→0 | | 1→0 | 1→0 | 1→0 | | | |
| 2 | DATA WRITING | data | | L | P1 | ecc | | | |
| 3 | STATUS INFOR-MATION WRITING | | 1→0 | | | | | | |
| 4 | STATUS INFOR-MATION WRITING | | AAAAh | | | | | | |
| 5 | DATA ERASURE | | | | | 0→1 | 0→1 | 0→1 | 0→1 |
| 6 | DATA ERASURE | | | | | FFFFh | FFFFh | FFFFh | FFFFh |
| 7 | STATUS INFOR-MATION WRITING | | 1→0 | | | | | | |
| 8 | STATUS INFOR-MATION WRITING | | 0000h | | | | | | |

NON-VOLATILE MEMORY AND NON-VOLATILE MEMORY DATA REWRITING METHOD

TECHNICAL FIELD

The present invention relates to a nonvolatile memory and a data rewriting method of the nonvolatile memory that can detect a defective data block and restore the data block to a normal storage state at a time of a restart after a system failure due to a power failure or the like occurs in the nonvolatile memory such for example as a NAND-type flash memory provided in an electronic device such as a memory card or the like.

BACKGROUND ART

Low-cost nonvolatile memories such as for example NAND-type flash memories suitable for storing a large amount of data have recently been widely used in household electrical appliances, portable electronic devices, and electronic devices such as memory cards and the like. When a system failure caused by a power failure, a malfunction or the like occurs in an electronic device having a flash memory, for example, part of data stored in the flash memory can be destroyed. As one method for protecting data from such a system failure, redundancy is provided to data written to the flash memory using a check sum or CRC (Cyclic Redundancy Check) code, for example, and a check sum is calculated from the data stored in the flash memory at a time of system restoration by turning on power to determine whether or not there is abnormality in the data.

As another method for data protection, an auxiliary nonvolatile memory capable of writing at higher speed than the flash memory is provided in addition to the flash memory, and the auxiliary nonvolatile memory stores bus information on a predetermined number of latest states of operation (statuses). FIG. 1 is a block diagram schematically showing a configuration of an electronic device having such a conventional flash memory. In FIG. 1, reference numeral 101 denotes the electronic device; reference numeral 102 denotes a CPU; reference numeral 103 denotes the flash memory provided as a main memory; reference numeral 104 denotes an auxiliary nonvolatile memory capable of writing at higher speed than the flash memory; reference numeral 105 denotes a bus for connecting the CPU 102 with the flash memory 103; reference numeral 106 denotes a bus branched off from the bus 105 and connected to the auxiliary nonvolatile memory 104; and reference numeral 107 denotes a signal line for supplying a control signal to the auxiliary nonvolatile memory 104.

Operation of the electronic device shown in FIG. 1 will next be described. For example, the CPU 102 supplies a control signal to the auxiliary nonvolatile memory 104 in a first half of each operation period of the flash memory 103, and the auxiliary nonvolatile memory 104 records information on the bus 105 via the bus 106 in response to the control signal. The auxiliary nonvolatile memory 104 records the bus information on only a plurality of latest statuses of statuses occurring in data writing, reading, erasing and other processing. The auxiliary nonvolatile memory 104 therefore does not need a very high storage capacity. Thus, even when a system failure due to a power failure or the like occurs during operation in the flash memory requiring a long time for writing operation and erasure operation, the bus information on a predetermined number of statuses immediately before the system failure is recorded in the auxiliary nonvolatile memory. Hence, the bus information recorded in the auxiliary nonvolatile memory is analyzed after system restoration to thereby determine a state of operation at the time of occurrence of the system failure, detect abnormality in data in the flash memory, and restore the flash memory to a normal storage state.

The conventional electronic device including a flash memory has the data protection function as described above. In the former method of using a check sum or CRC code, a state of operation at the time of a system failure cannot be detected, and therefore a complex system needs to be constructed to perform processing for system restoration or processing for restoring the data in the flash memory.

In the latter method of storing bus information in the auxiliary nonvolatile memory, it is necessary to analyze the stored bus information, determine a state of operation at the time of a system failure, and restore the data in the flash memory according to the determined state of operation, and a complex system needs to be constructed to perform the data restoration processing.

DISCLOSURE OF INVENTION

The present invention has been made to solve problems as described above, and it is accordingly an object of the present invention to provide a nonvolatile memory and a data rewriting method of the nonvolatile memory that can readily detect a state of operation of the nonvolatile memory such for example as a NAND-type flash memory at a time of a system failure due to a power failure or the like and quickly and reliably restore the nonvolatile memory to a normal storage state.

According to the present invention, there is provided a nonvolatile memory including a physical block as a storage unit, the physical block having a data area for storing data and a redundant area for storing various management information, wherein each redundant area includes: a logical block information storing area for storing information for identifying a logical block corresponding to a physical block including the redundant area; a previously used physical block information storing area for storing information for identifying a previously used physical block, which is an immediately preceding physical block with which the corresponding logical block was associated; and a status information storing area for storing status information for distinguishing a state of operation in each stage occurring in performing data rewriting operation using the physical block including the redundant area for data writing.

With the above composition, even when a system failure occurs due to a power failure or the like, a state of operation of the physical block for writing at a time of the system failure can be detected by referring to the status information storing area, and a previously used physical block of the physical block for writing can be identified by referring to the previously used physical block information storing area. Thus, appropriate restoration processing can be performed on the physical block where the data may be destroyed and the previously used physical block of the physical block according to the state of operation. Thereby the nonvolatile memory can be restored to a normal storage state.

In the nonvolatile memory according to the present invention, the status information storing area stores at least first status information indicating that the physical block including the status information storing area is in an erased state, second status information indicating that while data writing to the physical block including the status information storing area is completed, data of the corresponding previously used physical block is not erased, and third status information indicating that data writing to the physical block including the status information storing area is completed and that the data of the corresponding previously used physical block is erased.

Further, according to the present invention, there is provided a data rewriting method of a flash memory, the data rewriting method including: a first step for determining a logical block for data rewriting; a second step for determining a physical block for data writing from among empty blocks, which are erased physical blocks allowing writing; a third step for identifying a previously used physical block, which is a physical block associated with the logical block for rewriting, by referring to an address conversion table for associating the logical block with the physical block; a fourth step for writing data to the physical block for writing; a fifth step for erasing data from the previously used physical block; and a sixth step for updating the address conversion table such that the physical block for writing is associated with the logical block for rewriting; wherein in the physical block for writing, first status information indicating that the physical block for writing is in an erased state is set initially, second status information indicating that the writing of the data is completed is set after completion of processing at the fourth step, and third status information indicating that the erasure of the data from the previously used physical block is completed is set after completion of processing at the fifth step.

With such a composition, the status information is changed at a point of change in content of restoration processing, which is required in case of a system failure, for a state of operation in each stage occurring in data rewriting operation. The nonvolatile memory can therefore be readily restored to a normal storage state by referring to the status information.

Further, in the nonvolatile memory and the data rewriting method of the nonvolatile memory according to the present invention, the first status information, the second status information, and the third status information are represented by an identical number of bits; and the second status information is formed by changing binary data of one or a plurality of bits in a bit string representing the first status information from "1" to "0", and the third status information is formed by changing binary data of one or a plurality of bits in a bit string representing the second status information from "1" to "0".

With such formations, in view of the status information being varied by changing binary data of one or a plurality of bits in a bit string forming the status information from "1" to "0", even when a system failure occurred due to a power failure or the like in changing the status information and thus an abnormality occurs in which the status information does not have a proper value to be assumed, it is possible to determine whether the system failure occurred while the status information was being changed from the first status information to the second status information or whether the system failure occurred while the status information was being changed from the second status information to the third status information, by obtaining a logical product of the abnormal status information and the bit string representing the second status information and evaluating the logical product. Thus the state of operation of the nonvolatile memory can be detected in detail by the simple determination method, and the nonvolatile memory can be restored to a normal storage state quickly and reliably.

Further, in the data rewriting method of the nonvolatile memory according to the present invention, the second step for determining a physical block for data writing from among empty blocks, which are erased physical blocks allowing writing, includes: a seventh step for determining a number of empty blocks; and an eighth step for generating a random number, selecting one empty block from among a plurality of the empty blocks, and determining the selected empty block as a physical block to be written.

With such a composition, it is predicted that as the number of operations of rewriting data to the nonvolatile memory is increased, the number of operations of rewriting each physical block will be statistically equalized. Thus, the number of operations of rewriting each physical block can be equalized to thereby lengthen the life of the nonvolatile memory.

Further, in the data rewriting method of the nonvolatile memory according to the present invention, an empty block registration table including a plurality of storage units sequentially arranged so as to correspond in number with the empty blocks is provided, each of the storage units storing information for identifying an empty block, and the empty block to be written is determined by selecting one of the storage units in the empty block registration table according to the generated random number.

With such an arrangement, empty block management is facilitated. Also, each empty block can be selected with substantially the same probability only by the use of the simple method of associating empty blocks with consecutive integers given as relative addresses indicating respective storage units forming the empty block registration table and generating a random number in a predetermined numerical range according to the number of empty blocks.

BRIEF DESCRIPTION OF DRAWINGS

FIG. 5 is a diagram showing changes of data within physical blocks in data rewriting;

BEST MODE FOR CARRYING OUT THE INVENTION

Embodiments of the present invention will hereinafter be described with reference to the accompanying drawings. Incidentally, in order to clarify correspondences between elements or steps comprising an embodiment and elements or steps comprising an invention described in a claim, in the detailed description below, elements or steps Comprising an invention described in a claim which elements or steps correspond to elements or steps comprising an embodiment will be indicated by parentheses following the respective elements or steps of the embodiment as appropriate.

First Embodiment

Figure 1:
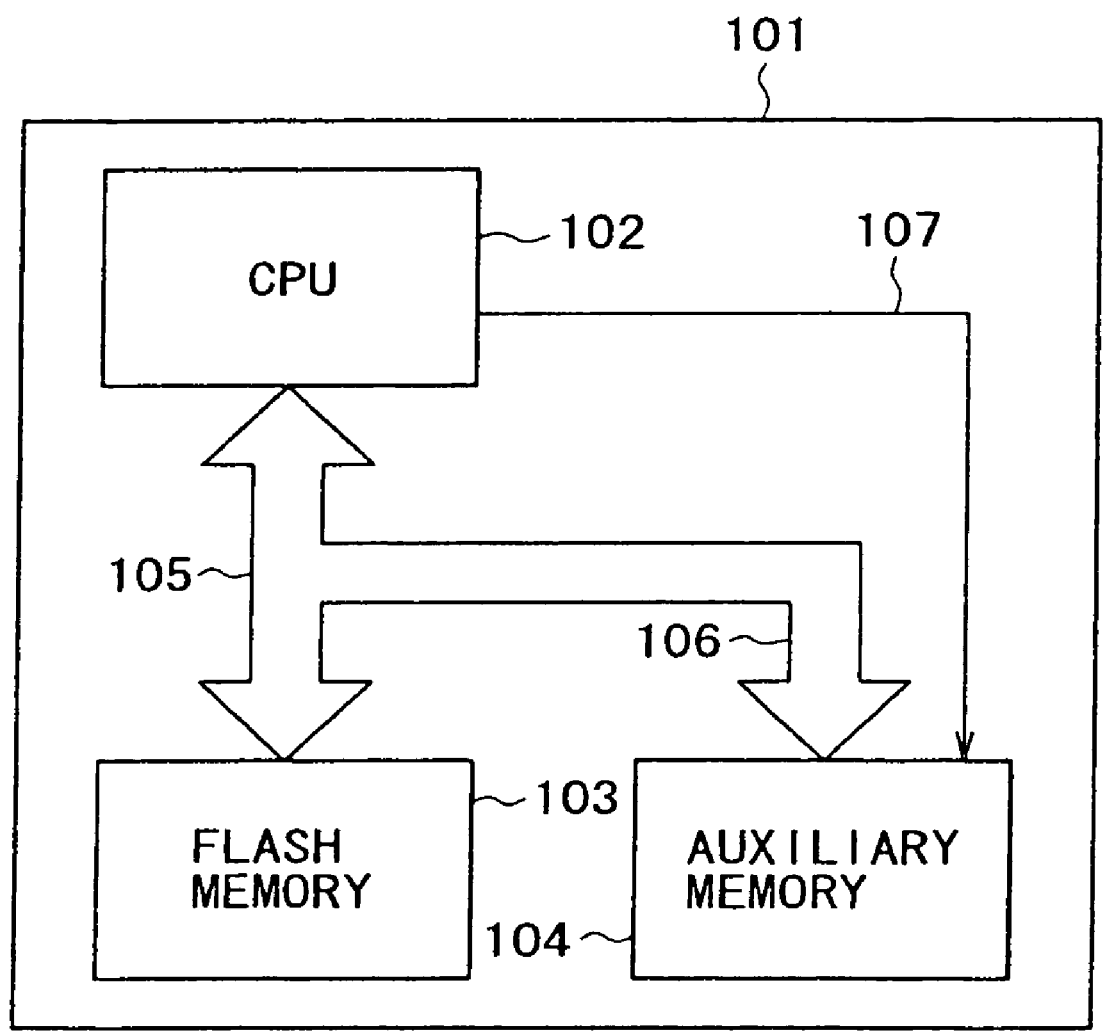
FIG. 1 is a block diagram schematically showing a configuration of a conventional electronic device having a flash memory.
Figure 2:
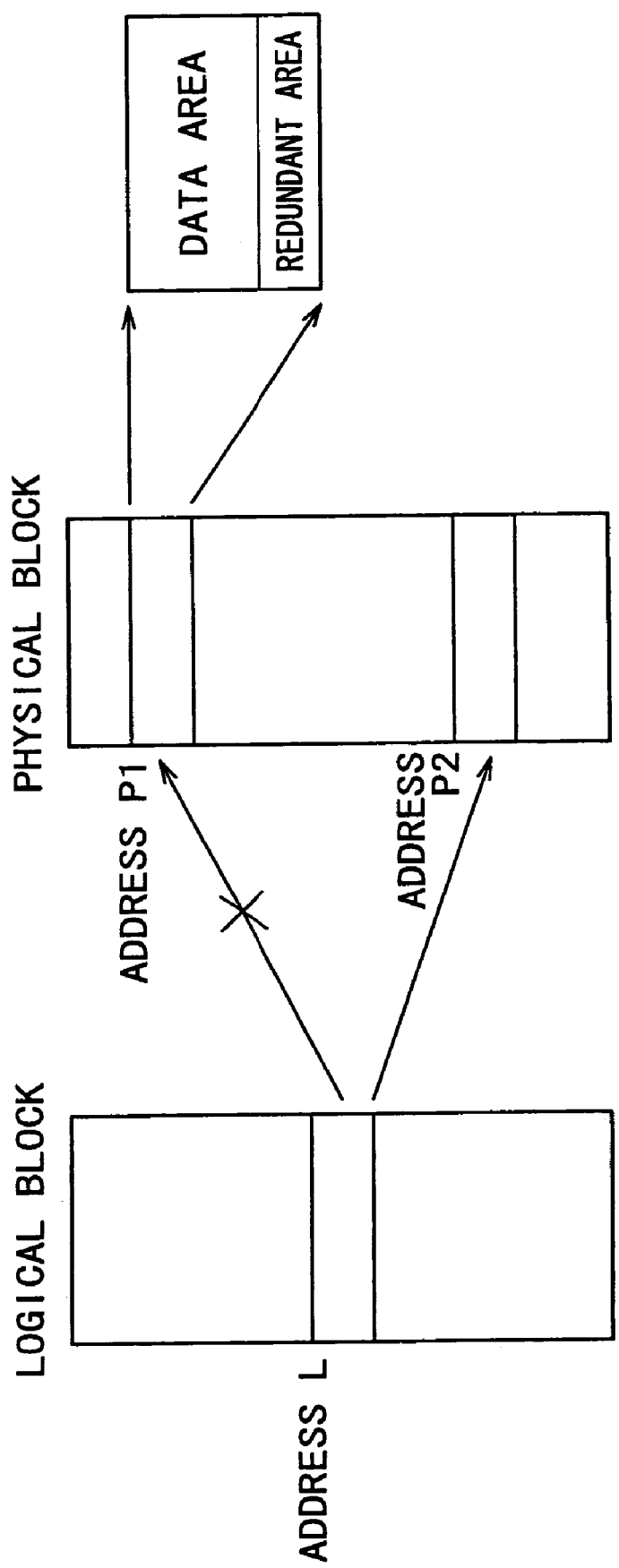
FIG. 2 is a diagram showing a relation between a logical block and a physical block in a storage area of a nonvolatile memory.

FIG. 2 is a diagram showing a relation between a logical block and a physical block in a storage area of a nonvolatile memory. Typical rewritable nonvolatile memories include a NAND-type flash memory. This type of flash memory is controlled in block units, and performs data erasure (usually an operation of writing binary data "1" to all bits) in block units. While in the present invention, basically writing is also performed in block units, data writable only by converting binary data of one or a plurality of arbitrary bits from "1" to "0" can be written in smaller storage units.

In accessing the flash memory, as shown in FIG. 2, a given logical block address is converted to a physical block address by referring to an address conversion table stored in a RAM connected to a CPU, for example, and thus a physical block in which to erase, write, or read data, for example, is identified. With such a method of access through a logical block address, in a case where a defect occurs in a physical block, even when processing operation for the defective block is performed on another empty block for substitution, the CPU for executing an application program or the like can make access using the same logical block address regardless of the block substitution.

Figure 3:
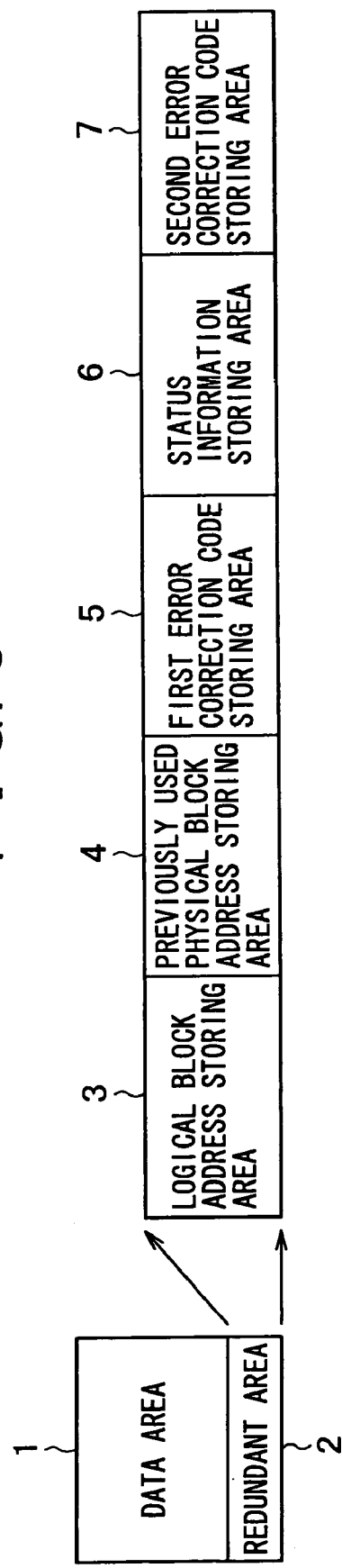
FIG. 3 is a diagram showing a data structure of management information stored in a physical block.

FIG. 3 is a diagram showing a data structure of management information stored in a physical block used in the present invention. In FIG. 3, reference numeral 1 denotes a data area for storing ordinary data, and reference numeral 2 denotes a redundant area for storing data of error correction code and the like and management information of the physical block. A data area 1 and a redundant area 2 comprise a physical block. Reference numeral 3 denotes a logical block address storing area (logical block information storing area) for storing an address of a logical block corresponding to the physical block having the redundant area. Reference numeral 4 denotes a previously used physical block address storing area (previously used physical block information storing area) for storing an address of an immediately preceding physical block with which the logical block corresponding to the physical block having the redundant area was associated (such an immediately preceding physical block will hereinafter be referred to as a previously used physical block). Reference numeral 5 is a first error correction code storing area for storing error correction code for the logical block address stored in the logical block address storing area 3 and the previously used physical block address stored in the previously used physical block address storing area 4. Reference numeral 6 denotes a status information storing area for storing status information indicating a state of operation in each stage occurring on the basis of processing performed on the physical block having the redundant area. Reference numeral 7 is a second error correction code storing area for storing error correction code for the data stored in the data area 1.

A data rewriting operation performed on the flash memory according to the present invention will next be described. A general procedure for rewriting data stored in an arbitrary logical block will first be described. First, a logical block for rewriting data is determined. Second, a search is made for an empty physical block. Third, the data for rewriting is written to the empty physical block. Fourth, data of a physical block that has been associated with the logical block to be rewritten is erased. Fifth, an address conversion table is updated so that the logical block to be rewritten is associated with the written physical block. Thus, by using the method of writing the data to the new physical block and erasing the data stored in the previously used physical block in data rewriting, even in case of a system failure due to a power failure, the system can be restored without losing management information related to the logical block to be rewritten, which information remains in either the written physical block or the previously used physical block, and also deterioration of elements due to concentrated writing to the same physical blocks can be prevented to thus lengthen the life of the flash memory itself.

Figure 4:
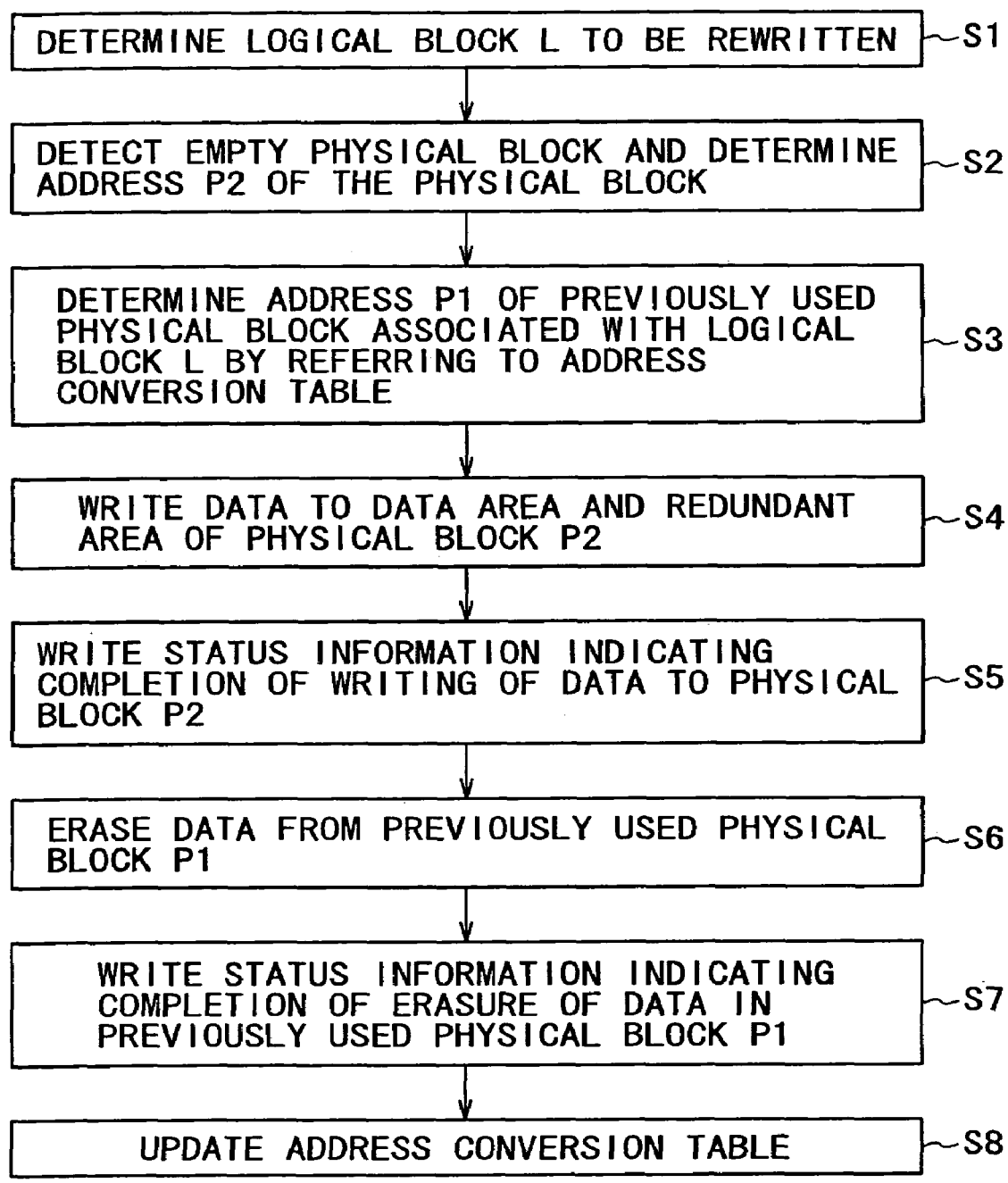
FIG. 4 is a flowchart of data rewriting operation in the nonvolatile memory.

Details of the data rewriting operation will next be described. FIG. 4 is a flowchart of the data rewriting operation. FIG. 5 is a diagram showing changes of data within a previously used physical block for erasure processing and a physical block for writing processing in data rewriting. Numbers shown at a left end of FIG. 5 are status numbers for identifying a state of operation in each stage occurring in a process of data rewriting. In this case, suppose that an address of a logical block to be rewritten is L, and that an address of a previously used physical block initially corresponding to the logical block in the address conversion table is P1. Incidentally, in the description below, a logical block and a physical block accessed by an address n will be referred to as a logical block n and a physical block n, respectively, as appropriate. First, the logical block L to be rewritten is determined (step S1 (first step)). Next, each physical block of the flash memory is searched for an address in ascending order or descending order, for example, to detect an empty block and determine an address P2 of the empty block (step S2 (second step)). Incidentally, in an initial state (status 0), the redundant area of the previously used physical block P1 for erasure processing stores "$0000_h$" (h denotes a hexadecimal number) as status information, stores L as a logical block address, and stores, as a previously used physical block address, an address P0 of a previously used physical block associated with the logical block L immediately before the physical block P1 is associated with the logical block L. The data area and the redundant area of the physical block P2 all store binary data "1," that is, the data area and the redundant area of the physical block P2 are in an erased state.

After the physical block P2 in which to write data is determined, the address P1 of the previously used physical block associated with the logical block L is determined by referring to the address conversion table (step S3 (third step)). In the physical block P2, the data is written to the data area 1; address data of the logical block L is written to the logical block address storing area 3 in the redundant area 2; address data of the immediately preceding previously used physical block P1 for erasure processing associated with the logical block L is written to the previously used physical block address storing area 4; error correction code for the address data of the logical block L and the address data of the physical block P1 is written to the first error correction code storing area 5; and error correction code for the data stored in the data area 1 is written to the second error correction code storing area 7 (step S4 (fourth step)). Status information "$FFFF_h$" (first status information) is retained in the status information storing area 6. Incidentally, in FIG. 5, "1→0" denotes that data is being written, and an arrow extending in a vertical direction of the figure denotes that a data value from a status in a preceding stage is retained as it is. Regarding the operation of writing the data to the physical block P2, a state of operation in the process of the data being written to the physical block P2 is indicated by status 1, and a state of operation after completion of the writing of the data to the physical block P2 is indicated by status 2, so that these states of operation are differentiated from each other.

After the completion of the writing of the data to the physical block P2, status information "$AAAA_h$" (second status information) is written to the status information storing area 6 to indicate the completion of the writing of the data to the physical block P2 (step S5). At this time, the same values are retained as the data of the other storing areas within the redundant area 2. Regarding the operation of writing the status information to the status information storing area 6, a state of operation in the process of the data being written to the status information storing area 6 is indicated by status 3, and a state of operation after completion of the writing of the status information "$AAAA_h$" to the status information storing area 6 is indicated by status 4, so that these states of operation are differentiated from each other.

After the completion of the writing of the status information "$AAAA_h$," the data of the previously used physical block P1 is erased (step S6 (fifth step)). As described above, this erasure operation is realized by writing binary data "1" to all memory cells within the previously used physical block P1. "0→1" in FIG. 5 denotes that the data is being erased. Regarding the operation of erasing the data from the previously used physical block P1, a state of operation in the process of the data being erased from the previously used physical block P1 is indicated by status 5, and a state of operation after completion of the erasing of the data from the previously used physical block P1 is indicated by status 6, so that these states of operation are differentiated from each other.

After the completion of erasure of the data from the previously used physical block P1, status information "$0000_h$" (third status information) is written to the status information storing area 6 within the redundant area 2 of the physical block P2 to indicate the completion of erasure of the data stored in the immediately preceding previously used physical block P1 with which the logical block L was associated (step S7). At this time, the same values are retained as the data of the other storing areas within the redundant area 2. Regarding the operation of writing the status information to the status information storing area 6, a state of operation in the process of the data being written to the status information storing area 6 is indicated by status 7, and a state of operation after completion of the writing of the status information "$0000_h$" to the status information storing area 6 is indicated by status 8, so that these states of operation are differentiated from each other. Then, in the address conversion table, the physical block associated with the logical block L is changed from the physical block P1 to the physical block P2 (step S8 (sixth step)), whereby the data rewriting operation is completed.

Figure 6:
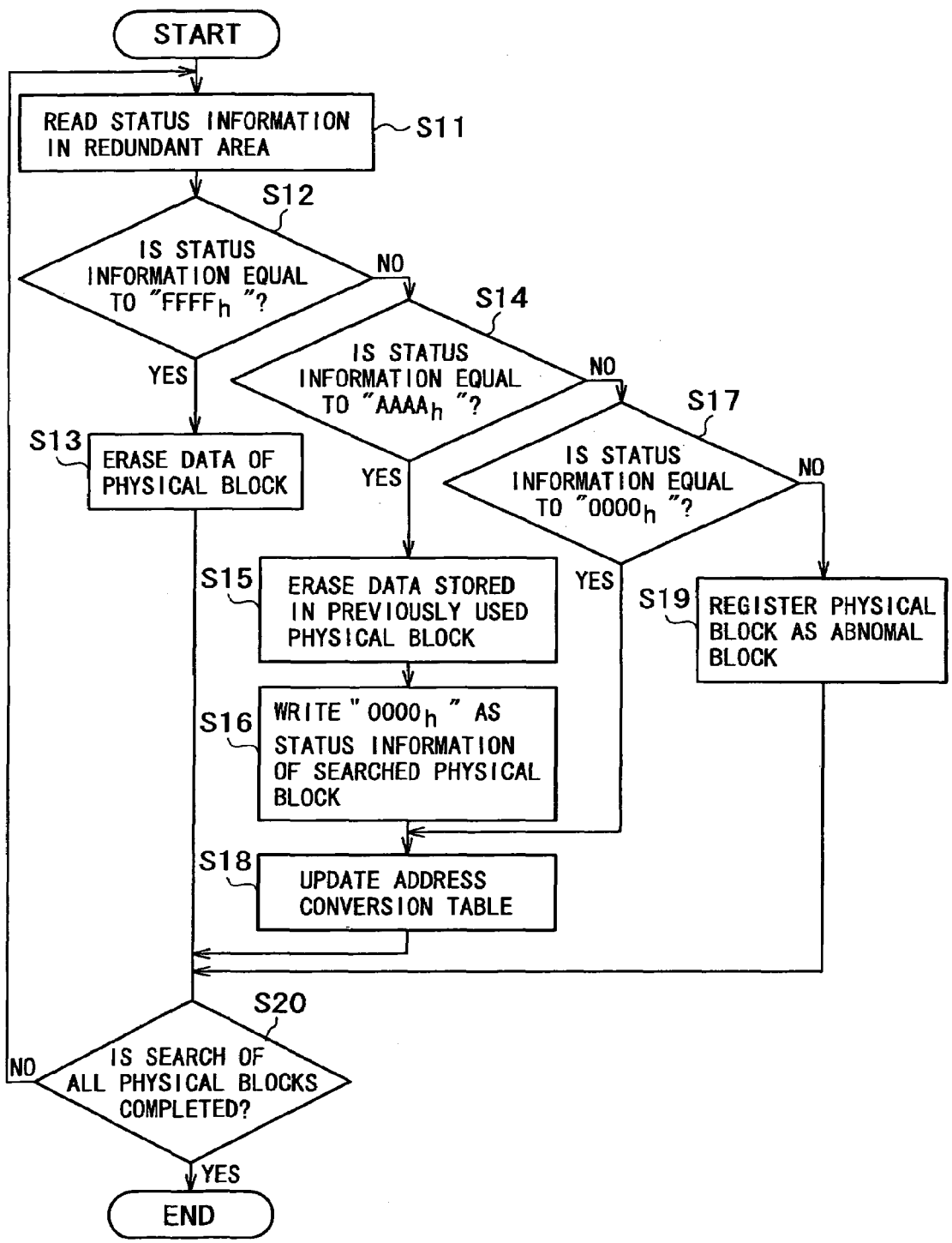
FIG. 6 is a flowchart of a storage state normalizing method according to a first embodiment of the present invention.

Description will next be made of a method of normalizing a data storing state in the flash memory, which accompanies system restoration processing performed after a system failure occurs due to a power failure, a malfunction or the like. FIG. 6 is a flowchart of the storage state normalizing method according to a first embodiment of the present invention. When the system is restarted, each physical block as a storage unit of the flash memory is searched to first read status information from a status information storing area 6 within a redundant area 2 (step S11). Next, whether or not the status information is equal to "$FFFF_h$" is determined (step S12). When the status information is equal to "$FFFF_h$," it indicates that data stored in the physical block should be in an erased state. Therefore, processing for erasing data from the physical block, that is, processing for writing binary data "1" to all memory cells within the physical block is performed (step S13). Thus, even when a system failure occurs due to a power failure or the like in the status 1 or the status 2 shown in FIG. 5, the physical block can be restored to a normal storage state in accordance with the status information by erasing data in a process of being written to the physical block or data written to the physical block. Incidentally, as for rewriting of data to be written to the physical block, it is possible to rewrite correct data using a method of accessing a network server or a host system of the electronic apparatus that caused the system failure, for example.

When the status information is not equal to "$FFFF_h$" at the step S12, whether or not the status information is equal to "$AAAA_h$" is determined (step S14). When the status information is equal to "$AAAA_h$," the writing of data to the physical block is completed, but data erasure from a previously used physical block for the physical block may not be completed. Therefore the data of the previously used physical block is erased (step S15). Also, "$0000_h$" is written to the status information storing area 6 of the physical block (step S16). Thus, even when a system failure occurs due to a power failure or the like in the status 4, the status 5, or the status 6 shown in FIG. 5, the searched physical block and the previously used physical block for the physical block can be restored to a normal storage state by changing the status information of the searched physical block and erasing data of the previously used physical block which data is not erased or in a process of being erased.

When the status information is not equal to "$AAAA_h$" at the step S14, whether or not the status information is equal to "$0000_h$" is determined (step S17). After the step S16 and when the status information is equal to "$0000_h$" at the step S17, a corresponding logical block is determined by referring to the logical block address storing area 3 of the searched physical block, and the searched physical block is registered as a physical block corresponding to the logical block in the address conversion table (step S18). Thereby, the address conversion table lost due to a system failure caused by a power failure or the like is reconstructed.

When the status information is not equal to "$0000_h$" at the step S17, it is determined that the searched physical block is an abnormal block, and the address of the physical black is registered in an abnormal block table (step S19). After the step S13, after the step S18, and after the step S19, whether or not search of all physical blocks is completed is determined (step S20). When the search of all the physical blocks is not completed, the processing returns to the step S11 to perform the same processing on a next physical block. When the search of all the physical blocks is completed, the processing represented in FIG. 6 is ended, and then processing for an abnormal block to be described later is performed.

Conceivable factors in determination that a physical block is an abnormal block in the above search processing on all the physical blocks include a system failure due to a power failure or the like while the status information of the written physical block in the status 3 is being changed from "$FFFF_h$" to "$AAAA_h$," a system failure due to a power failure or the like while the status information of the physical block being erased in the status 5 is being changed from "$0000_h$" to "$FFFF_h$," and a system failure due to a power failure or the like while the status information of the written physical block in the status 7 is being changed from "$AAAA_h$" to "$0000_h$." Of these factors, a system failure due to a power failure or the like while the status information of the physical block being erased in the status 5 is being changed from "$0000_h$" to "$FFFF_h$" can be dealt with by performing the processing at the step S15 shown in FIG. 6 for the corresponding written physical block, so that the physical block judged to be an abnormal block is brought into an erased state and the status information of the physical block is corrected to a normal value of "$FFFF_h$." Thus, the physical block on which erasure processing is completed can be deleted from the abnormal block table.

Figure 7:
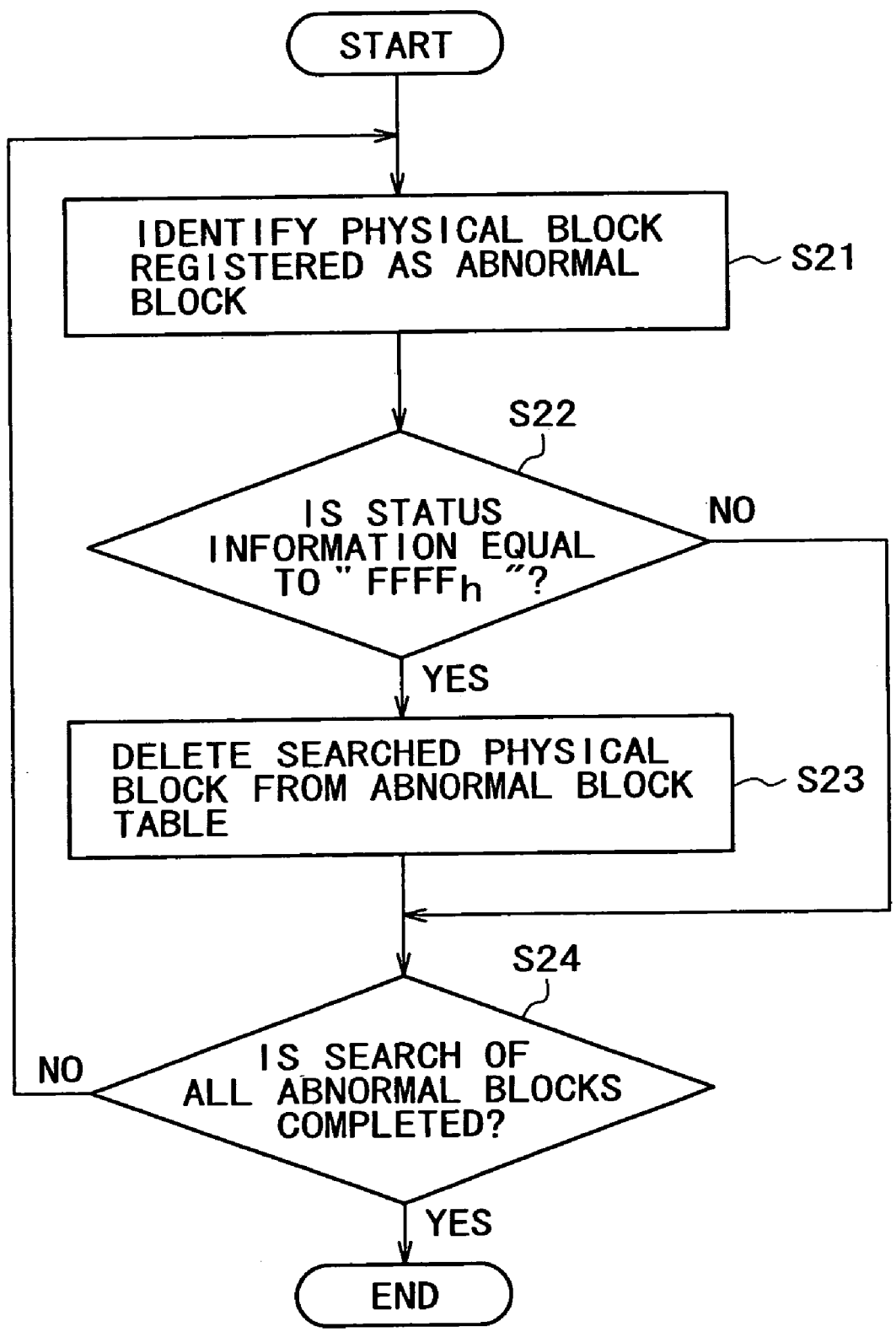
FIG. 7 is a flowchart of processing for searching an erased physical block among abnormal blocks.

FIG. 7 is a flowchart of processing for searching an erased physical block among abnormal blocks. First, in order to search each physical block registered as an abnormal block, an address of a registered physical block is retrieved from the abnormal block table to identify the physical block to be searched (step S21). Next, whether or not the status information is equal to "$FFFF_h$" is determined (step S22). The status information equal to "$FFFF_h$" indicates that the physical block is a previously used physical block on which erasure processing is completed. Therefore the address of the searched physical block is deleted from the abnormal block table (step S23). After the step S23, and when the status information is not equal to "$FFFF_h$" at the step S22, whether or not search of all the physical blocks registered as abnormal blocks is completed is determined (step S24). When the search of all the physical blocks is not completed, the processing returns to the step S21 to perform the same processing on a next physical block identified on the basis of the abnormal block table. When the search of all the physical blocks is completed, the processing represented in FIG. 7 is ended, and next processing for an abnormal block to be described later is performed.

Figure 8:
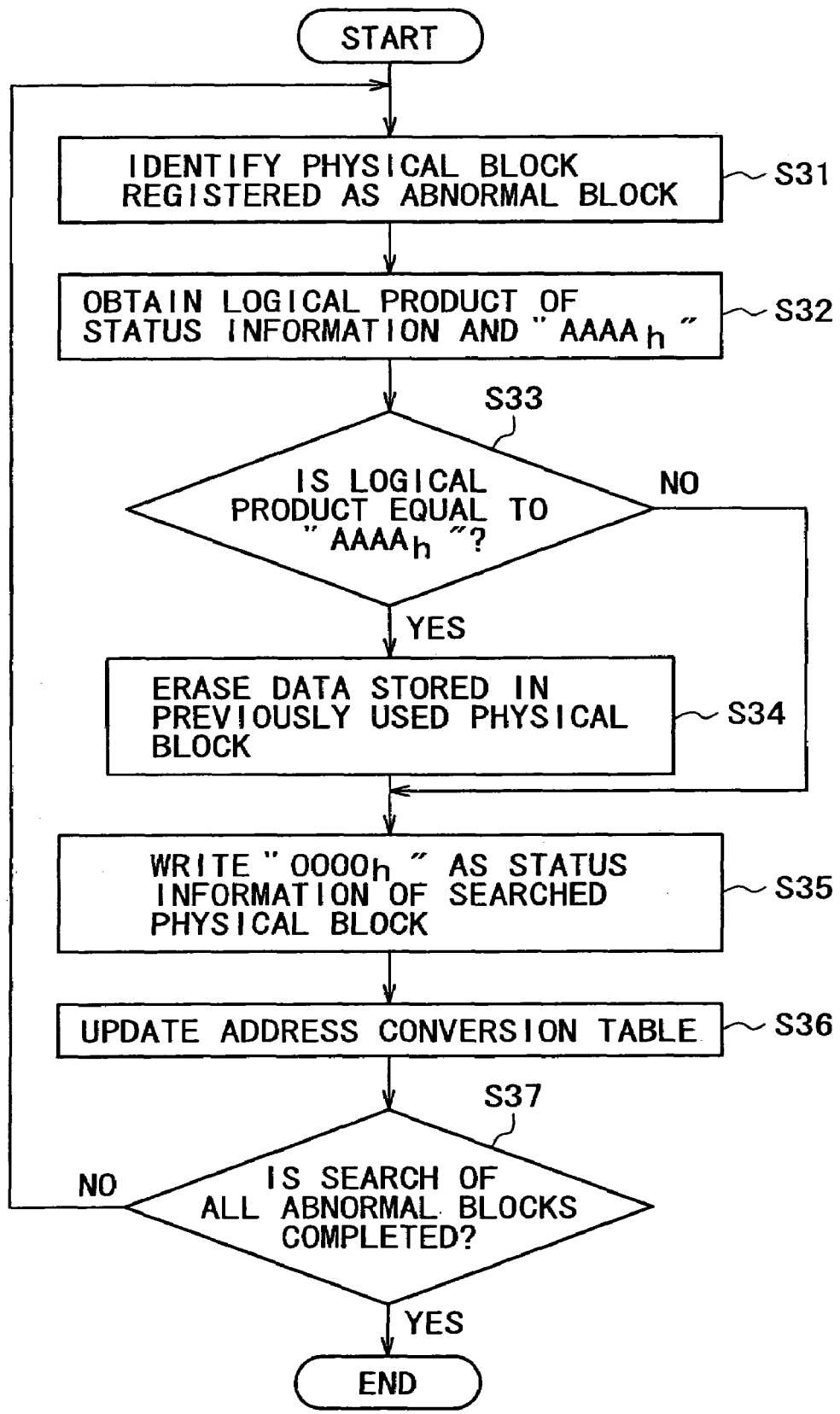
FIG. 8 is a flowchart of normalization processing for an abnormal block.

FIG. 8 is a flowchart of normalization processing for an abnormal block. First, in order to search each physical block registered as an abnormal block, an address of a registered physical block is retrieved from the abnormal block table corrected by the processing represented in FIG. 7 to identify the physical block to be searched (step S31). Next, status information is extracted from a redundant area 2 of the physical block being searched, and a logical product of the status information and "$AAAA_h$" is obtained (step S32). As described above, data is written in a NAND-type flash memory by changing "1s" of binary data to "0s." Hence, in a case where the status information has a value different from a proper value to be assumed due to a system failure caused by a power failure or the like when the status information of the written physical block is being changed from "$FFFF_h$" to "$AAAA_h$" in the status 3, the logical product of the status information and "$AAAA_h$" is equal to "$AAAA_h$." In a case where the status information has a value different from a proper value to be assumed due to a system failure caused by a power failure or the like when the status information of the written physical block is being changed from "$AAAA_h$" to "$0000_h$" in the status 7, the logical product of the status information and "$AAAA_h$" is not equal to "$AAAA_h$."

In view of the above characteristics of the status information, at a next step, whether or not the logical product of the status information and "$AAAA_h$" is equal to "$AAAA_h$" is determined (step S33). When the logical product is equal to "$AAAA_h$," data writing to the searched physical block is completed, while erasure of data from a previously used physical block of the searched physical block is not completed. Therefore the data of the previously used physical block identified by an address stored in a previously used physical block address storing area 4 is erased (step S34). After the step S34, and when it is determined that the logical product of the status information and "$AAAA_h$" is not equal to "$AAAA_h$" at the step S33, "$0000_h$" is written to a status information storing area 6 of the searched physical block (step S35). Even when a system failure caused by a power failure or the like occurs in the status 3 shown in FIG. 5, by performing the processing at the step S34 and the step S35, the erasure of the data from the previously used physical block and the writing of the new status information are performed to thereby restore the searched physical block and the previously used physical block to a normal storage state in accordance with the status information. Also, even when a system failure caused by a power failure or the like occurs in the status 7 shown in FIG. 5, by performing the processing at the step S35, the writing of the new status information is performed to thereby restore the searched physical block to a normal storage state in accordance with the status information.

Next, a corresponding logical block is determined by referring to a logical block address storing area 3 of the searched physical block, and the searched physical block is registered as a physical block corresponding to the logical block in the address conversion table (step S36). By performing the processing for all the physical blocks registered as abnormal blocks, the address conversion table lost due to a system failure caused by a power failure or the like can be restored.

Next, whether search of all the physical blocks registered as abnormal blocks is completed is determined (step S37). When the search of all the physical blocks is not completed, the processing returns to the step S31 to perform the same processing on a next physical block identified on the basis of the abnormal block table. When the search of all the physical blocks is completed, the processing is ended.

As described above, in the flash memory according to the first embodiment that performs data rewriting by assigning a new physical block in an erased state to a logical block for data rewriting, writing data to the physical block, and erasing data from a previously used physical block that has been associated with the logical block, a redundant area 2 includes a logical block address storing area 3, a previously used physical block address storing area 4, and a status information storing area 6. Therefore, even when a system failure occurs due to a power failure or the like, a state of operation of a physical block being written at a time of the system failure can be detected by referring to the status information storing area 6, and a previously used physical block of the physical block being written at the time of the system failure can be identified by referring to the previously used physical block address storing area 4. Thus, appropriate restoration processing can be performed on the physical block where data may be destroyed and the previously used physical block of the physical block according to the state of operation. Thereby the flash memory can be restored to a normal storage state.

Further, status information is formed so as to have "$FFFF_h$" indicating that the physical block is in an erased state, "$AAAA_h$" indicating that while data writing to the physical block to be written is completed, data of a corresponding previously used physical block is not erased, and "$0000_h$" indicating that data writing to the physical block to be written is completed and that the data of the corresponding previously used physical block is erased. Therefore, even in a case where data destruction occurs in the physical block, it suffices to erase the written physical block when the status information is "$FFFF_h$," and it suffices to erase the previously used physical block when the status information is "$AAAA_h$." The status information is thus changed at a point of change in content of restoration processing, which is required in case of a system failure, for each status occurring in data rewriting operation. The flash memory can therefore be readily restored to a normal storage state by referring to the status information.

Further, the status information of a physical block for writing is changed from "$FFFF_h$," to "$AAAA_h$," to "$0000_h$," as data rewriting proceeds. Therefore, in view of the status information being varied by changing binary data of predetermined bits in a bit string forming the status information from "1" to "0," even when a system failure occurred due to a power failure or the like in changing the status information and thus an abnormality occurs in which the status information does not have a proper value to be assumed, it is possible to determine whether the system failure occurred while the status information was being changed from "$FFFF_h$," to "$AAAA_h$," or whether the system failure occurred while the status information was being changed from "$AAAA_h$," to "$0000_h$," by obtaining a logical product of the abnormal status information and "$AAAA_h$," and evaluating the logical product. Thus the state of operation of the flash memory can be detected in detail by a simple determination method, and the flash memory can be restored to a normal storage state quickly and reliably.

Second Embodiment

The second embodiment is different from the first embodiment in that the second embodiment has an empty block registration table for sequentially registering empty block identifying information given as an address or the like of an empty block, for example, to detect empty blocks for data writing.

Figure 9:
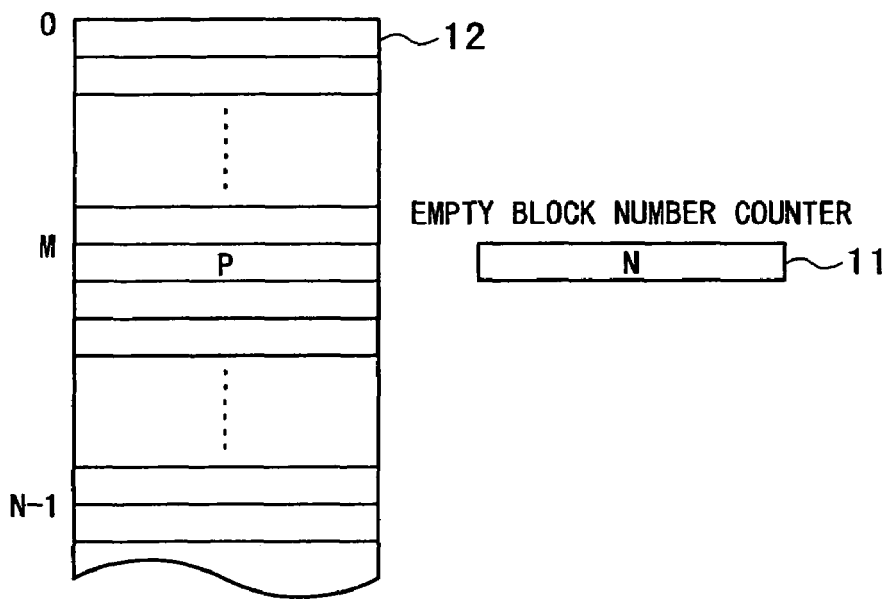
FIG. 9 is a diagram showing an empty block registration table and the like used in a second embodiment of the present invention.

FIG. 9 is a diagram showing the empty block registration table and the like. In FIG. 9, reference numeral 11 denotes an empty block number counter for recording the number of empty blocks, and reference numeral 12 denotes the empty block registration table including a plurality of storage units arranged sequentially. Both the empty block number counter 11 and the empty block registration table 12 can be constructed in a work area within a RAM connected to a CPU, for example. As shown in FIG. 9, when the number of empty blocks stored in the empty block number counter 11 is N, addresses of the empty blocks are stored in respective storage units accessible by using as indices addresses 0 to (N−1) given as relative addresses in the empty block registration table 12.

Figure 10:
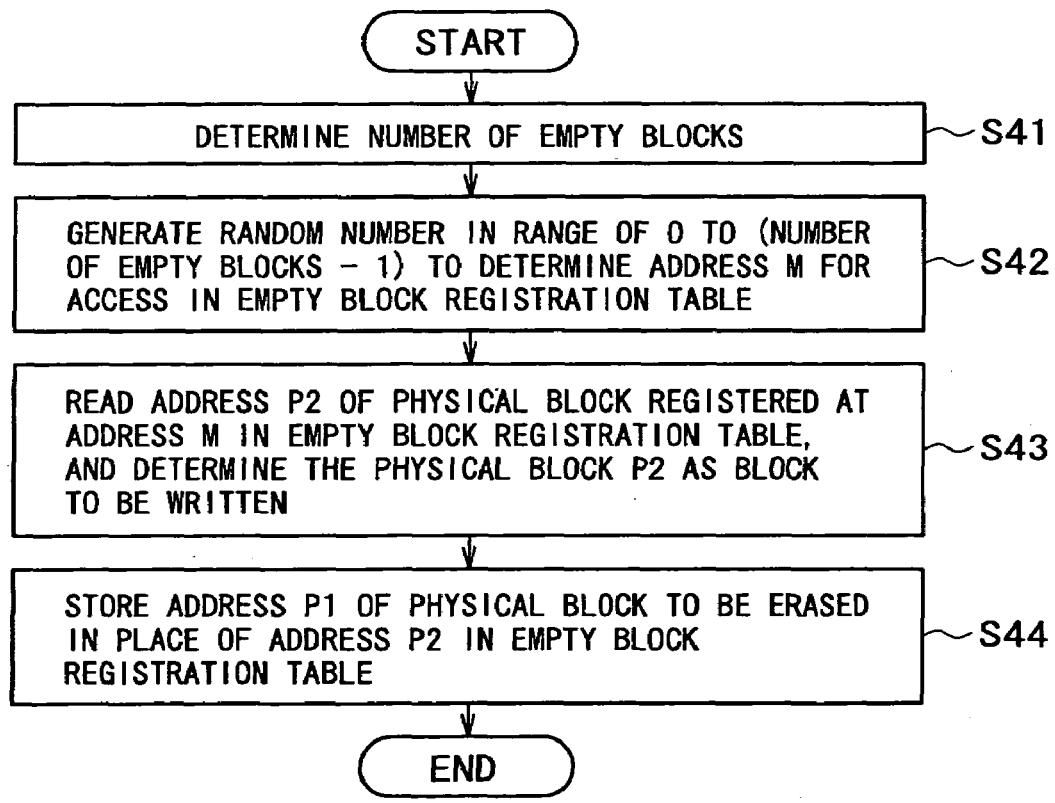
FIG. 10 is a flowchart of a method of detecting an appropriate empty block according to the second embodiment of the present invention.

A method of memory control of the second embodiment will next be described. An operation of rewriting data stored in an arbitrary logical block is basically the same as the rewriting operation represented in the flowchart of FIG. 4, and therefore description thereof will be omitted. As described above, the second embodiment is different from the first embodiment in a method of detecting an appropriate empty block, which is represented as the step S2. FIG. 10 is a flowchart of the method of detecting an appropriate empty block according to the second embodiment of the present invention. First, referring to the empty block number counter 11, the number of empty blocks, or physical blocks that are in an erased state and allow data to be written therein at that point in time is determined (step S41 (seventh step)). Supposing that the number of empty blocks is N, a random number is generated in a range of 0 to (N−1) to select an appropriate empty block from among the N empty blocks, whereby an address M for access in the empty block registration table 12 is determined (step S42). Next, an address P2 of a physical block registered at the address M in the empty block registration table 12 is read, and the physical block P2 is determined as a physical block to be written (step S43 (eighth step)). When the physical block P2 to be written is determined, an address P1 of a physical block for erasure involved in this writing operation is written in place of the address P2 in the storage unit at the address M in the empty block registration table 12 (step S44). Incidentally, after the physical block P2 to be written is determined, as shown in FIG. 4, data is written to the physical block P2 to be written, data of the previously used physical block P1 is erased, and the address conversion table is updated, whereby data rewriting is completed.

As described above, the second embodiment has similar effects to those of the first embodiment, and also has the step S41 for determining the number of empty blocks and the step S43 for generating a random number, selecting one empty block from among a plurality of empty blocks according to the random number, and determining the selected empty block as a physical block to be written. It is therefore predicted that as the number of operations of rewriting data to the flash memory is increased, the number of operations of rewriting each physical block will be statistically equalized. Thus, the number of operations of rewriting each physical block can be equalized with a simple arrangement to thereby lengthen the life of the flash memory. Concentrated writing to the same physical blocks in a flash memory such as a NAND-type flash memory tends to deteriorate the elements, and it is therefore important to equalize the number of rewriting operations among physical blocks in order to lengthen the life of the flash memory.

In addition, since the empty block registration table 12 storing addresses of empty blocks in respective storage units sequentially arranged so as to correspond in number with the empty blocks is provided, and one empty block to be written is determined by selecting one of the storage units in the empty block registration table 12 according to a random number generated, empty block management is facilitated. Also, each empty block can be selected with substantially the same probability only by the use of the simple method of associating empty blocks with consecutive integers given as relative addresses indicating respective storage units forming the empty block registration table and generating a random number in a predetermined numerical range according to the number of empty blocks.

It is to be noted that the flash memories and the data rewriting methods of the flash memories described according to the first embodiment and the second embodiment are intended not to limit the present invention but to be illustrative of the present invention. The technical scope of the present invention is defined by claims, and various changes in design may be made within the technical scope described in the claims. For example, the status information is not limited to "$FFFF_h$," "$AAAA_h$," and "$0000_h$." Arbitrary bit strings may be set as the first, second, and third status information when the second status information indicating that while data writing to the physical block to be written is completed, data of a corresponding previously used physical block is not erased is formed by changing binary data of one or a plurality of bits in a bit string representing the first status information indicating an erased state from "1" to "0", and the third status information indicating that data writing to the physical block to be written is completed and that the data of the corresponding previously used physical block is erased is formed by changing binary data of one or a plurality of bits in a bit string representing the second status information from "1" to "0".

The invention claimed is:

1. A nonvolatile memory comprising a physical block as a storage unit, said physical block having a data area for storing data and a redundant area for storing various management information, wherein each said redundant area includes:
a logical block information storing area for storing information for identifying a logical block corresponding to a physical block including said redundant area;
a previously used physical block information storing area for storing information for identifying a previously used physical block, which is an immediately preceding physical block with which the corresponding logical block was associated; and
a status information storing area for storing status information for distinguishing a state of operation in each stage occurring in performing data rewriting operation using the physical block including said redundant area for data writing; and
wherein said status information storing area stores at least first status information indicating that the physical block including said status information storing area is in an erased state, second status information indicating that while data writing to the physical block including said status information storing area is completed, data of the corresponding previously used physical block is not erased, and third status information indicating that data writing to the physical block including said status information storing area is completed and that the data of the corresponding previously used physical block is erased.

2. The nonvolatile memory as claimed in claim 1,
wherein the first status information, the second status information, and the third status information are represented by an identical number of bits; and
the second status information is formed by changing binary data of one or a plurality of bits in a bit string representing the first status information from"1" to"0". and the third status information is formed by changing binary data of one or a plurality of bits in a bit string representing the second status information from"1" to "0".

3. A nonvolatile memory data rewriting method for rewriting data in a nonvolatile memory, said nonvolatile memory including a physical block as a storage unit, said physical block having a data area for storing data and a redundant area for storing various management information, said data rewriting method comprising:
a first step for determining a logical block for data rewriting;
a second step for determining a physical block for data writing from among empty blocks, which are erased physical blocks allowing writing;
a third step for identifying a previously used physical block, which is a physical block associated with the logical block for rewriting, by referring to an address conversion table for associating the logical block with the physical block;
a fourth step for writing data to the physical block for writing;
a fifth step for erasing data from the previously used physical block; and
a sixth step for updating the address conversion table such that the physical block for writing is associated with the logical block for rewriting;

wherein in the physical block for writing, first status information indicating that the physical block for writing is in an erased state is set initially, second status information indicating that the writing of the data is completed is set after completion of processing at the fourth step, and third status information indicating that the erasure of the data from the previously used physical block is completed is set after completion of processing at the fifth step.

4. The nonvolatile memory data rewriting method as claimed in claim 3,
wherein the first status information, the second status information, and the third status information are represented by an identical number of bits; and
the second status information is formed by changing binary data of one or a plurality of bits in a bit string representing the first status information from"1" to"0," and the third status information is formed by changing binary data of one or a plurality of bits in a bit string representing the second status information from"1" to"0."

5. The nonvolatile memory data rewriting method as claimed in claim 3,
wherein the second step includes:
a seventh step for determining a number of empty blocks; and
an eighth step for generating a random number, selecting one empty block from among a plurality of the empty blocks, and determining the empty block as a physical block to be written.

6. The nonvolatile memory data rewriting method as claimed in claim 5,
wherein an empty block registration table including a plurality of storage units sequentially arranged so as to correspond in number with the empty blocks is provided, each of the storage units storing information for identifying an empty block; and
the empty block to be written is determined by selecting one of the storage units in the empty block registration table according to the generated random number.

7. A nonvolatile memory data rewriting method for rewriting data in a nonvolatile memory, said nonvolatile memory including a physical block as a storage unit, said physical block having a data area for storing data and a redundant area for storing various management information, each said redundant area having a status information storing area for storing status information for distinguishing a state of operation in each stage occurring in a physical block for writing in performing data rewriting operation, said data rewriting method comprising:
a first step for determining a logical block for data rewriting;
a second step for determining a physical block for data writing from among empty blocks, which are erased physical blocks allowing writing;
a third step for identifying a previously used physical block, which is a physical block associated with the logical block for rewriting, by referring to an address conversion table for associating the logical block with the physical block;
a fourth step for writing data to the physical block for writing;
a fifth step for erasing data from the previously used physical block; and a sixth step for updating the address conversion table such that the physical block for writing is associated with the logical block for rewriting;

wherein the second step includes:

a seventh step for determining a number of empty blocks; and an eighth step for generating a random number, selecting one empty block from among a plurality of the empty blocks, and determining the empty block as a physical block to be written.

* * * * *